United States Patent
Zhang et al.

(10) Patent No.: US 8,854,750 B2
(45) Date of Patent: Oct. 7, 2014

(54) SATURATION-BASED LOOP CONTROL ASSISTANCE

(75) Inventors: Haotian Zhang, Longmont, CO (US); Haitao Xia, San Jose, CA (US)

(73) Assignee: LSI Corporation, Milpitas, CA (US)

( * ) Notice: Subject to any disclaimer, the term of this patent is extended or adjusted under 35 U.S.C. 154(b) by 79 days.

(21) Appl. No.: 13/562,140

(22) Filed: Jul. 30, 2012

(65) Prior Publication Data

US 2014/0029128 A1 Jan. 30, 2014

(51) Int. Cl.
*G11B 5/02* (2006.01)

(52) U.S. Cl.
USPC .................. 360/25; 360/26; 360/31; 360/32; 360/65

(58) Field of Classification Search
None
See application file for complete search history.

(56) References Cited

U.S. PATENT DOCUMENTS

| | | | | |
|---|---|---|---|---|
| 5,844,920 A * | 12/1998 | Zook et al. | ................... | 714/769 |
| 6,125,154 A * | 9/2000 | Sutardja | ........................ | 375/345 |
| 6,219,192 B1 * | 4/2001 | Gopalaswamy et al. | ........ | 360/25 |
| 6,314,278 B1 * | 11/2001 | Zamat | ........................ | 455/239.1 |
| 6,501,607 B2 * | 12/2002 | Keirn et al. | ...................... | 360/31 |
| 6,535,553 B1 | 3/2003 | Limberg et al. | | |
| 7,248,630 B2 | 7/2007 | Modrie | | |
| 7,257,764 B2 | 8/2007 | Suzuki | | |
| 7,317,586 B1 * | 1/2008 | Egan et al. | ...................... | 360/39 |
| 7,421,017 B2 | 9/2008 | Takatsu | | |
| 7,502,189 B2 | 3/2009 | Sawaguchi | | |
| 7,715,471 B2 | 5/2010 | Werner | | |
| 8,018,360 B2 | 9/2011 | Nayak | | |
| 8,046,666 B2 | 10/2011 | Park et al. | | |
| 8,059,517 B2 * | 11/2011 | Liu et al. | ................... | 369/124.01 |
| 8,077,419 B1 * | 12/2011 | Pai et al. | ........................ | 360/65 |
| 8,208,213 B2 | 6/2012 | Liu | | |
| 8,457,261 B1 * | 6/2013 | Shi et al. | ........................ | 375/345 |
| 8,730,609 B1 * | 5/2014 | Tang et al. | ...................... | 360/65 |
| 2006/0123285 A1 | 6/2006 | De Araujo | | |
| 2006/0274620 A1 * | 12/2006 | Haddad | ...................... | 369/53.31 |
| 2008/0018508 A1 * | 1/2008 | Filipovic et al. | .............. | 341/118 |
| 2008/0200139 A1 * | 8/2008 | Kobayashi | ................ | 455/232.1 |
| 2009/0002862 A1 | 1/2009 | Park et al. | | |
| 2011/0072335 A1 | 3/2011 | Liu et al. | | |
| 2011/0075569 A1 | 3/2011 | Marrow | | |
| 2011/0164332 A1 | 7/2011 | Cao | | |
| 2011/0167227 A1 | 7/2011 | Yang et al. | | |
| 2012/0019946 A1 | 1/2012 | Aravind | | |
| 2012/0056612 A1 | 3/2012 | Mathew | | |
| 2012/0069891 A1 | 3/2012 | Zhang | | |
| 2012/0124119 A1 | 5/2012 | Yang | | |
| 2012/0218039 A1 * | 8/2012 | Ripley et al. | .................. | 330/129 |
| 2012/0236430 A1 | 9/2012 | Tan | | |

OTHER PUBLICATIONS

U.S. Appl. No. 13/346,556, Unpublished (filed Jan. 9, 2012) (Haitao Xia).

(Continued)

*Primary Examiner* — Dismery Mercedes
(74) *Attorney, Agent, or Firm* — Hamilton DeSanctis & Cha

(57) ABSTRACT

The present inventions are related to systems and methods for data processing, and more particularly to data processing using distortion-correction loops with saturation-based assistance.

20 Claims, 4 Drawing Sheets

(56) References Cited

OTHER PUBLICATIONS

U.S. Appl. No. 13/491,062, Unpublished (filed Jun. 7, 2012) (Jin Lu).
U.S. Appl. No. 13/545,784, Unpublished (filed Jul. 10, 2012) (Yu Liao).
U.S. Appl. No. 13/551,507, Unpublished (filed Jul. 17, 2012) (Ming Jin).
U.S. Appl. No. 13/525,188, Unpublished (filed Jun. 15, 2012) (Yang Han).
U.S. Appl. No. 13/525,182, Unpublished (filed Jun. 15, 2012) (Yang Han).
U.S. Appl. No. 13/239,719, Unpublished (filed Sep. 22, 2011) (Haitao Xia).
U.S. Appl. No. 13/272,209, Unpublished (filed Oct. 12, 2011) (Yu Liao).

\* cited by examiner

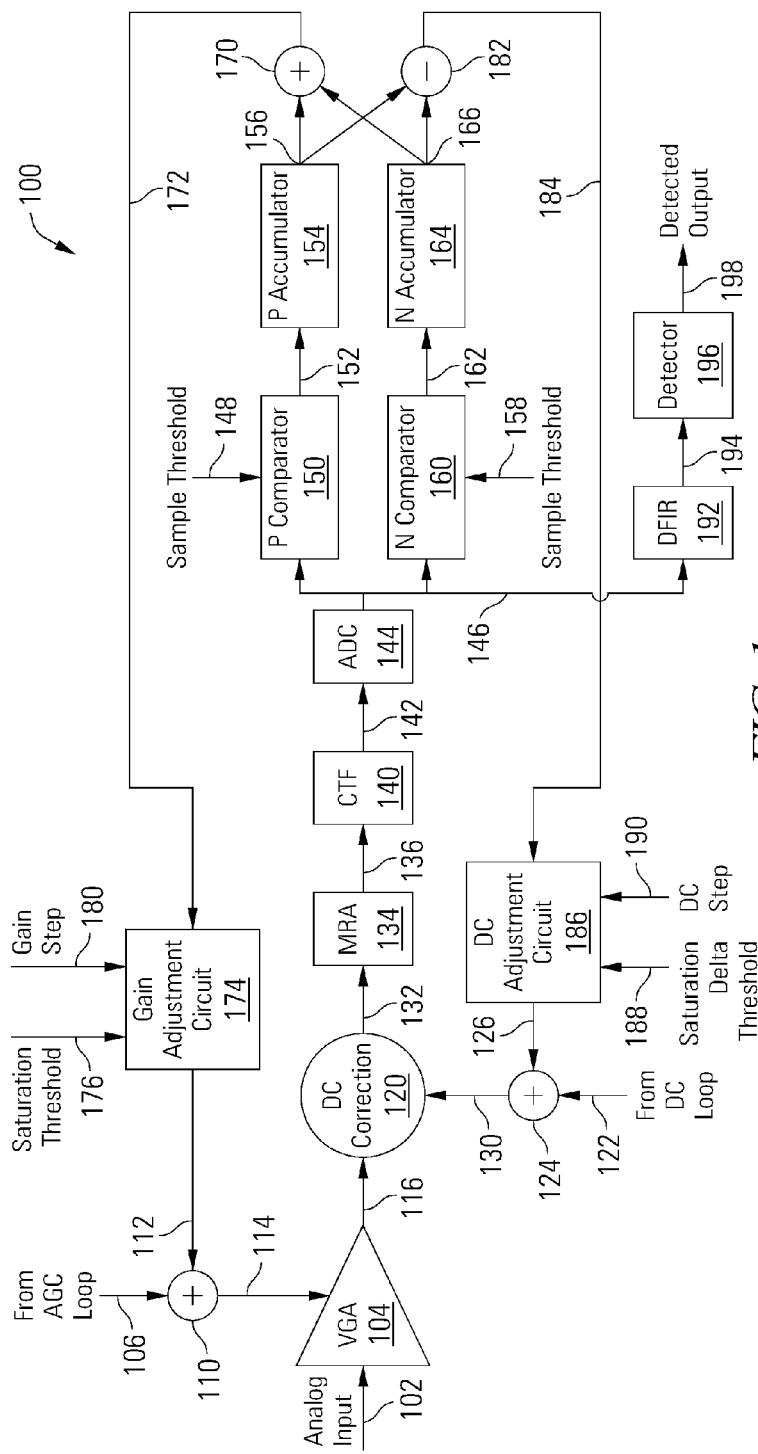
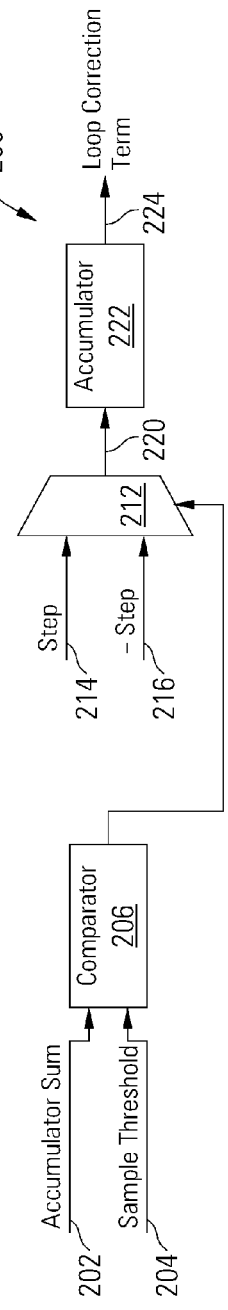
FIG. 1
FIG. 2

US 8,854,750 B2

SATURATION-BASED LOOP CONTROL ASSISTANCE

BACKGROUND

Various data processing systems include analog to digital converter circuits to periodically sample an analog electrical signal, yielding digital data. The processing systems may include feedback loops such as automatic gain control loops and DC correction loops that detect gain-related distortion or DC offsets in the analog electrical signal based on downstream processing of the digital data. Error signals based on the gain-related distortion or DC offset may be fed back to control a variable gain amplifier or DC compensation circuit in order to reduce the gain-related distortion or DC offset. Typically, the loop gain on such error signals is relatively small to reduce loop noise that would decrease performance. However, if the analog electrical signal experiences large gain-related distortion or a large DC offset, the feedback loops with small loop gain are slow to correct the distortion or offset.

Hence, for at least the aforementioned reasons, there exists a need in the art for advanced feedback loop correction of distortion when data processing.

BRIEF SUMMARY

The present inventions are related to systems and methods for data processing, and more particularly to data processing using distortion-correction loops with saturation-based assistance. The saturation-based loop control assistance disclosed herein may be applied to any data processing system with an analog to digital converter and feedback or control loops based on any quantity or value in the system. In some embodiments, the saturation-based loop control assistance is applied to a data processing system with an analog to digital converter operable to convert an analog signal to a digital signal, with feedback signals used to correct analog gain distortions and analog DC offsets or biases. The saturation-based loop control assistance may also be used to assist other types of feedback signals. The feedback signals may generally have a relatively low loop gain to prevent or reduce loop noise. Loop correction signals are generated based on the existence of saturated values from the analog to digital converter, and the loop correction signals are used to effectively increase the loop gain of the feedback signals in the presence of relatively high distortions, such as a high analog gain distortion or large DC offset in either the positive or negative direction. The loop gain of feedback signals may thus remain low during normal operation to reduce loop noise, and may be increased in particularly noisy conditions to rapidly correct distortion.

This summary provides only a general outline of some embodiments of the inventions. Many other objects, features, advantages and other embodiments of the invention will become more fully apparent from the following detailed description, the appended claims and the accompanying drawings.

BRIEF DESCRIPTION OF THE DRAWINGS

A further understanding of the various embodiments of the present inventions may be realized by reference to the figures which are described in remaining portions of the specification. In the figures, like reference numerals are used throughout several figures to refer to similar components. In some instances, a sub-label consisting of a lower case letter is associated with a reference numeral to denote one of multiple similar components. When reference is made to a reference numeral without specification to an existing sub-label, it is intended to refer to all such multiple similar components.

FIG. 1 depicts a data processing system including analog to digital converter saturation-based loop control assistance in accordance with some embodiments of the present inventions;

FIG. 2 depicts an adjustment circuit yielding a loop correction term that may be included in a data processing system including saturation-based loop control assistance in accordance with some embodiments of the present inventions;

DETAILED DESCRIPTION OF THE INVENTION

Figure 3:
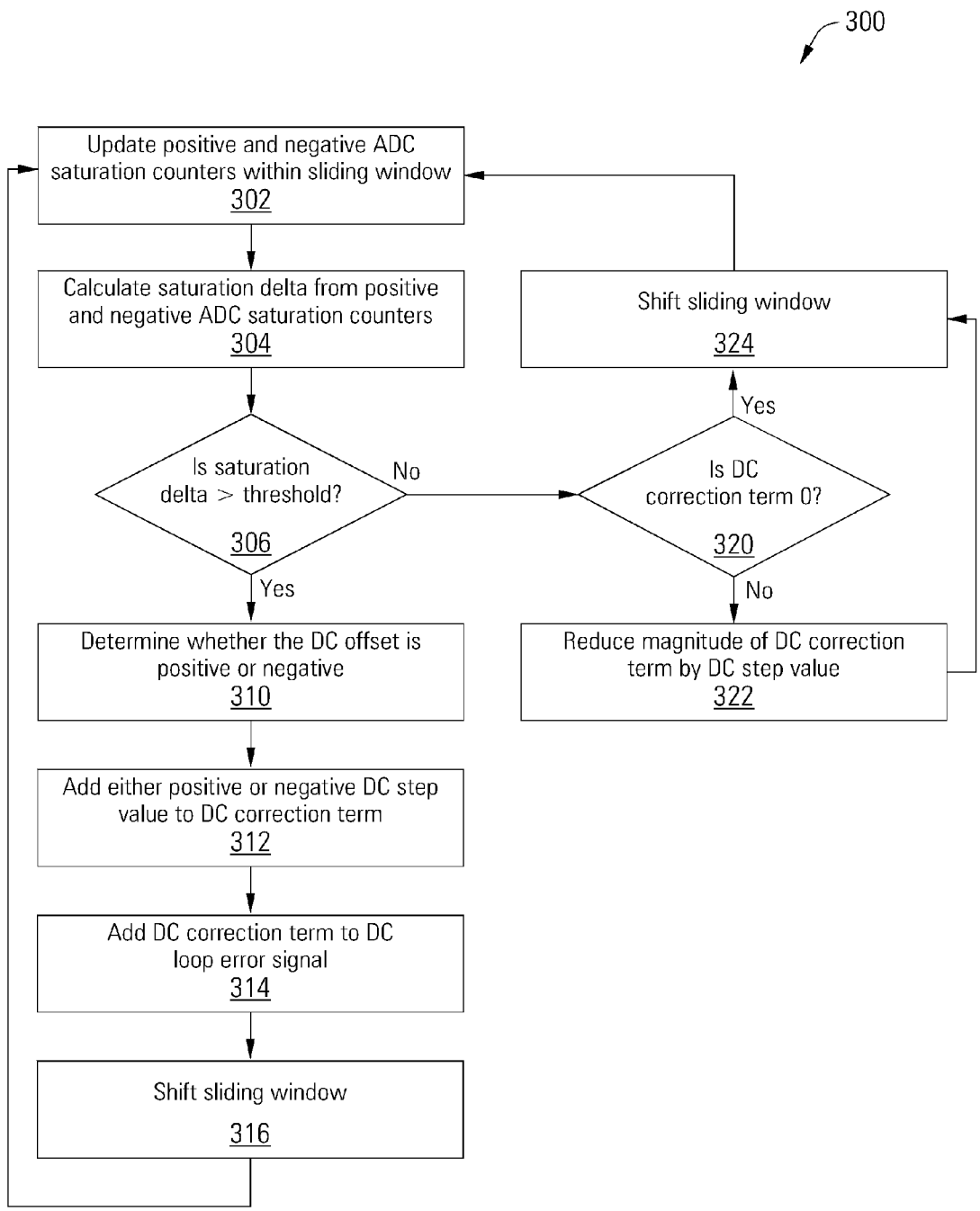
FIG. 3 is a flow diagram showing a method for correcting a DC offset while processing data with saturation-based loop control assistance in accordance with some embodiments of the present inventions.

The present inventions are related to systems and methods for data processing, and more particularly to data processing using distortion-correction loops with saturation-based assistance. The saturation-based loop control assistance disclosed herein may be applied to any data processing system with an analog to digital converter and feedback or control loops based on any quantity or value in the system. In some embodiments, the saturation-based loop control assistance is applied to a data processing system with an analog to digital converter operable to convert an analog signal to a digital signal, with feedback signals used to correct analog gain distortions and analog DC offsets or biases. The saturation-based loop control assistance may also be used to assist other types of feedback signals. The feedback signals may generally have a relatively low loop gain to prevent or reduce loop noise. Loop correction signals are generated based on the existence of saturated values from the analog to digital converter, and the loop correction signals are used to effectively increase the loop gain of the feedback signals in the presence of relatively high distortions, such as a high analog gain distortion or large DC offset in either the positive or negative direction. The loop gain of feedback signals may thus remain low during normal operation to reduce loop noise, and may be increased in particularly noisy conditions to rapidly correct distortion.

Turning to FIG. 1, a data processing circuit 100 is depicted that includes analog to digital converter saturation-based loop control assistance in accordance with some embodiments of the present inventions. Data processing circuit 100 includes a variable gain amplifier 104 that receives an analog signal 102, and that controls the gain on the analog signal 102 based on the level of a gain control signal 114. During normal operation, the gain control signal 114 may have a relatively low loop gain to reduce loop noise that could be caused by variable gain amplifier 104. In the presence of more substantial gain distortion, however, the loop gain of gain control signal 114 is increased by the saturation-based loop control assistance disclosed herein to more rapidly correct the gain distortion. Variable gain amplifier 104 provides an analog signal 116 that may be amplified or even attenuated with respect to analog signal 102. Based upon the disclosure provided herein, one of ordinary skill in the art will recognize a variety of circuitry that may be used to provide variable gain amplification of analog signal 102. In some cases, analog signal 102 is derived from a read/write head assembly (e.g., 520, FIG. 5) that is disposed in relation to a storage medium (e.g., 516, FIG. 5). In other cases, analog signal 102 is derived from a receiver circuit (e.g., 604, FIG. 6) that is operable to receive a signal from a transmission medium (e.g., 606, FIG. 6). The transmission medium may be wired or wireless. Based upon the disclosure provided herein, one of ordinary skill in the art will recognize a variety of source from which analog input 102 may be derived.

The analog signal 116 is provided to a DC correction circuit 120 or DC recovery circuit that applies a DC bias to correct some or all of any DC offset in the analog signal 116, controlled by a DC correction control signal 130. The DC correction circuit 120 may correct a DC offset in either direction, either positive or negative, in analog signal 116. During normal operation, the DC correction control signal 130 may have a relatively low loop gain to reduce loop noise that could be caused by DC correction circuit 120. In the presence of more substantial DC offset, however, the loop gain of DC correction control signal 130 is increased by the saturation-based loop control assistance disclosed herein to more rapidly correct the DC offset. The DC correction may take place before the variable gain amplification in some embodiments. DC correction circuit 120 yields a DC-corrected analog signal 132.

The saturation-based loop control assistance disclosed herein may be applied to any types of feedback or control loops, and is not limited to the examples presented herein of an automatic gain control loop or DC loop.

Amplified and DC-corrected analog signal 132 may be further processed as desired. In some embodiments, analog signal 132 is provided to a magneto-resistive asymmetry (MRA) correction circuit 134, which provides compensation in analog signal 132 for the magneto-resistive asymmetry characteristic of a magnetic write head (e.g., 520, FIG. 5), yielding MRA-corrected analog signal 136. A continuous time filter (CTF) 140 may be used to filter the analog signal 136, for example to provide waveform smoothing and phase equalization of filtered analog signal 142.

Analog to digital converter circuit 144 converts processed analog signal 142 into a corresponding series of digital samples 146. Analog to digital converter circuit 144 may be any circuit known in the art that is capable of producing digital samples corresponding to an analog input signal. Based upon the disclosure provided herein, one of ordinary skill in the art will recognize a variety of analog to digital converter circuits that may be used in relation to different embodiments of the present invention.

Digital samples 146 are provided to an equalizer circuit 192. Equalizer circuit 192 applies an equalization algorithm to digital samples 146 to yield an equalized output 194. In some embodiments of the present invention, equalizer circuit 192 is a digital finite impulse response filter circuit as are known in the art. Equalized output 194 is provided to data detector circuit 196.

Data detector circuit 196 is operable to apply a data detection algorithm to digital samples 146. In some embodiments of the present invention, data detector circuit 196 is a Viterbi algorithm data detector circuit as are known in the art. In other embodiments of the present invention, data detector circuit 196 is a maximum a posteriori data detector circuit as are known in the art. Of note, the general phrases "Viterbi data detection algorithm" or "Viterbi algorithm data detector circuit" are used in their broadest sense to mean any Viterbi detection algorithm or Viterbi algorithm detector circuit or variations thereof including, but not limited to, bi-direction Viterbi detection algorithm or bi-direction Viterbi algorithm detector circuit. Also, the general phrases "maximum a posteriori data detection algorithm" or "maximum a posteriori data detector circuit" are used in their broadest sense to mean any maximum a posteriori detection algorithm or detector circuit or variations thereof including, but not limited to, simplified maximum a posteriori data detection algorithm and a max-log maximum a posteriori data detection algorithm, or corresponding detector circuits. Based upon the disclosure provided herein, one of ordinary skill in the art will recognize a variety of data detector circuits that may be used in relation to different embodiments of the present invention. Upon completion of application of the data detection algorithm to the digital samples 146, data detector circuit 196 provides a detector output 198.

Detector output 198 may be provided to error signal generating circuits (not shown) such as an automatic gain control (AGC) loop and a DC loop, operable to generate a gain control signal 106 based on distortion detected in the detector output 198 and to generate a DC correction control signal 122 based on DC offset detected in the detector output 198. Any suitable feedback loop circuits may be used to generate the gain control signal 106 and DC correction control signal 122 or other feedback signals. For example, the gain control signal 106 and DC correction control signal 122 may be generated in circuits such as those disclosed in U.S. Pat. No. 8,046,666 filed Aug. 8, 2007 for "Combined DC Restoration Double Detection And Loops", which is incorporated by reference herein for all purposes. Based upon the disclosure provided herein, one of ordinary skill in the art will recognize a variety of feedback loop circuits that may be used in relation to different embodiments of the present invention. Again, the loop gain applied in such feedback loop circuits may be relatively low to avoid introducing loop noise in analog signals 116 and 132 by variable gain amplifier 104 and DC correction circuit 120 during normal operation.

The digital samples 146 from analog to digital converter circuit 144 are also provided to a positive comparator 150 and a negative comparator 160. The positive comparator 150 compares the values in digital samples 146 with an upper sample threshold 148 and provides an indication at output 152 at each time period of whether the current sample or value of digital samples 146 is greater than (or, in some embodiments, equal to) the sample threshold 148. The negative comparator 160 compares the values in digital samples 146 with a lower sample threshold 158 and provides an indication at output 162 of whether the current value of digital samples 146 is less than (or, in some embodiments, equal to) the sample threshold 158. The upper and lower thresholds 148 and 158 are programmable in some embodiments, providing additional flexibility. In these embodiments, the thresholds and thus the sensitivity to saturation can be adjusted during operation based on data processing results. For example, by bringing the upper and lower thresholds 148 and 158 closer together, the data processing circuit 100 will be quicker to increase the loop gain on gain control signal 114 and on DC correction control signal 122.

In some embodiments, the analog to digital converter circuit 144 produces digital samples 146 with a range of values that includes both negative and positive numbers, such as −31 to 31. In other embodiments, the analog to digital converter circuit 144 produces digital samples 146 with a range of values that excludes negative numbers, such as 0 to 255.

Programmable thresholds 148 and 158 establish the upper and lower levels, respectively, at which the values in the digital samples 146 from analog to digital converter circuit 144 are determined to be in "saturation", triggering the saturation-based loop control assistance. Values greater than (or equal to) the upper sample threshold 148 are interpreted as a positively saturated value, and values less than (or equal to) the lower sample threshold 158 are interpreted as a negatively saturated value. In some embodiments, these threshold values are set 1 or 2 values from the upper and lower limits in the ADC values. For example, given an ADC with output values ranging from −31 to 31, the lower and upper threshold values may be set at −30 and 30, respectively, or −29 and 29, although this is merely a non-limiting example. Similarly, given an ADC with an output range of 0 to 255, the lower and upper threshold values may be set for example at 2 and 253, respectively, to establish the positive and negative saturation levels. In the latter example, ADC output values of 0 or 1 would be identified as negatively saturated samples, and ADC output values of 254 or 255 would be identified as positively saturated samples. In other embodiments, the threshold values 148 and 158 may be set at the highest and lowest possible values from analog to digital converter circuit 144, with positive comparator 150 and negative comparator 160 asserting the outputs 152 and 162 when the digital samples 146 are at the highest and lowest possible levels.

The output 152 is provided to a positive saturation accumulator 154 that provides a count at output 156 of the number of digital samples 146 that were greater than (or equal to) the upper sample threshold 148 within a sliding window. For example, the sliding window may be set to (but is not limited to) include the last 100 samples in digital samples 146. Thus, if 30 of the last 100 samples in digital samples 146 were greater than or equal to sample threshold 148, positive saturation accumulator 154 would yield an indication at output 156 that 30 samples were positively saturated. At each clock cycle or other time period, the positive saturation accumulator 154 drops the comparison result from output 152 for the oldest sample being pushed out of the sliding window and includes the most recent comparison result from output 152. Based upon the disclosure provided herein, one of ordinary skill in the art will recognize a variety of accumulator circuits that may be used to determine the number of saturated samples within a sliding window in relation to different embodiments of the present invention. For example, the positive saturation accumulator 154 may include a shift register having a width sufficient to include comparison results for each of the most recent samples in digital samples 146 within the sliding window, and an adder to yield the total number of comparison results which were asserted.

The output 162 from negative comparator 160 is provided to a negative saturation accumulator 164 that provides a count at output 166 of the number of digital samples 146 that were less than (or equal to) the lower sample threshold 158 within a sliding window. For example, the sliding window may be set to (but is not limited to) include the last 100 samples in digital samples 146. Thus, if 20 of the last 100 samples in digital samples 146 were less than or equal to lower sample threshold 158, negative saturation accumulator 164 would yield an indication at output 166 that 20 samples were negatively saturated. At each clock cycle or other time period, the negative saturation accumulator 164 drops the comparison result from output 162 for the oldest sample being pushed out of the sliding window and includes the most recent comparison result from output 162. Based upon the disclosure provided herein, one of ordinary skill in the art will recognize a variety of accumulator circuits that may be used to determine the number of saturated samples within a sliding window in relation to different embodiments of the present invention. For example, the negative saturation accumulator 164 may include a shift register having a width sufficient to include comparison results for each of the most recent samples in digital samples 146 within the sliding window, and an adder to yield the total number of comparison results which were asserted. (The sliding windows used by positive saturation accumulator 154 and negative saturation accumulator 164 are set to the same length in some embodiments, although in other embodiments different lengths may be used by normalizing the results.)

The data processing circuit 100 detects relatively large gain distortion with positive and negative comparators 150 and 160 and positive and negative saturation accumulators 154 and 164. The data processing circuit 100 differentiates between gain distortion and DC offset using adder 170 and subtractor 182. The adder 170 adds the outputs 156 and 166 from positive saturation accumulator 154 and negative saturation accumulator 164 to yield a total accumulated saturation output 172, reporting the combined number of positively and negatively saturated samples from digital samples 146 within the windows. A gain-related distortion will produce a roughly balanced number of positively and negatively saturated samples unless the analog signal 102 has a sufficient DC offset that the varying analog signal is shifted away from one of the limits in the analog to digital converter circuit 144. By adding the outputs 156 and 166 from positive saturation accumulator 154 and negative saturation accumulator 164 in adder 170 to yield a total accumulated saturation output 172, gain-related distortion is detected even in the presence of a DC offset.

A DC offset in analog signal 102 is identified using subtractor 182, which yields at output 184 the difference or delta between output 156 from positive saturation accumulator 154 and output 166 from negative saturation accumulator 164. (Notably, output 156 may be subtracted from output 166, with the interpretation of the result being inversed by data processing circuit 100.) The sign of the difference at delta accumulated saturation output 184 indicates the direction of the DC offset in analog signal 102, while the magnitude of the difference at output 184 indicates the amount of DC offset. If a positive DC offset exists in analog signal 102, the number of positively saturated samples in digital samples 146 will be increased and the number of negatively saturated samples will be decreased, resulting in a positive difference reported at output 184. If a negative DC offset exists in analog signal 102, the number of positively saturated samples in digital samples 146 will be decreased and the number of negatively saturated samples will be increased, resulting in a negative difference reported at delta accumulated saturation output 184.

A gain adjustment circuit 174 compares the number of saturated samples reported in total accumulated saturation output 172 with a saturation threshold 176 to determine whether to enable the saturation-based loop control assistance. If the conditions are met for the gain adjustment circuit 174 to apply the saturation-based loop control assistance, the gain adjustment circuit 174 generates a gain loop correction signal 112 that gradually increases over time as the conditions remain satisfied, and that gradually decreases over time when the conditions are no longer met to enable the saturation-based loop control assistance.

The gain adjustment circuit 174 increases the gain loop correction signal 112 by an amount specified by a gain step signal 180 when the total accumulated saturation output 172 is greater than the saturation threshold 176. The gain adjustment circuit 174 decreases the gain loop correction signal 112 by the amount specified by a gain step signal 180 when the total accumulated saturation output 172 is less than the saturation threshold 176. In some embodiments, the gain adjustment circuit 174 adjusts the gain loop correction signal 112 once per update period, for example once per clock cycle T, or once every 4T or 8T, etc. The saturation-based loop control assistance disclosed herein is not limited to any particular update period.

The gain adjustment circuit 174 may ensure that the gain loop correction signal 112 remains within a predetermined range between 0 and a maximum value to avoid an undesirably large loop gain. Thus, when the total accumulated saturation output 172 has been below the saturation threshold 176 for some time, the gain loop correction signal 112 will stop decreasing at zero. When the total accumulated saturation output 172 has been above the saturation threshold 176 for some time, the gain loop correction signal 112 will stop increasing at a maximum value, even if the total accumulated saturation output 172 remains above the saturation threshold 176.

The gain loop correction signal 112 is applied in some embodiments by adding it to the gain control signal 106 in adder 110 to yield combined gain control signal 114. The relatively low gain of gain control signal 106 is thus increased by the addition of gain loop correction signal 112 during periods of distortion that cause saturation in the digital samples 146 from the analog to digital converter circuit 144.

The saturation threshold 176 prevents the gain adjustment circuit 174 from increasing the loop gain of gain control signal 114 when only a few samples are saturated within the sliding window. This allows the analog to digital converter circuit 144 to be calibrated to use substantially all of the available range for the expected amplitude of analog signal 142 during normal operation, which may cause a small number of saturated samples, without triggering the gain adjustment circuit 174.

A saturation delta threshold 188 compares the number of saturated samples reported in delta accumulated saturation output 184 with a saturation delta threshold 188 to determine whether to enable the saturation-based DC loop control assistance. If the conditions are met for the DC adjustment circuit 186 to apply the saturation-based loop control assistance, the DC adjustment circuit 186 generates a DC loop correction signal 126 that gradually increases over time in a positive direction when the delta accumulated saturation output 184 is above the saturation delta threshold 188, and that gradually increases over time in a negative direction when the delta accumulated saturation output 184 is below the negative value of the saturation delta threshold 188, and that gradually returns to 0 when the magnitude of the delta accumulated saturation output 184 is below the saturation delta threshold 188.

In some embodiments, the gain control signal 114 sets the gain of variable gain amplifier 104, and when a gain distortion causes saturation, the gain should be reduced. The gain loop correction signal 112 in these instances is thus subtracted from gain control signal 106 to more rapidly reduce the gain of the variable gain amplifier 104.

The DC adjustment circuit 186 increases the DC loop correction signal 126 by an amount specified by a DC step signal 190 when the magnitude of the delta accumulated saturation output 184 is greater than the saturation delta threshold 188, and in a direction indicated by the sign of the delta accumulated saturation output 184. The DC adjustment circuit 186 decreases the saturation delta threshold 188 (returning it in the direction of 0) by the amount specified by the DC step signal 190 when the magnitude of the delta accumulated saturation output 184 is less than the saturation delta threshold 188. In some embodiments, the DC adjustment circuit 186 adjusts the DC loop correction signal 126 once per update period, for example once per clock cycle T, or once every 4T or 8T, etc. The saturation-based loop control assistance disclosed herein is not limited to any particular update period.

The DC adjustment circuit 186 may ensure that the DC loop correction signal 126 remains within a predetermined range between a maximum negative value and a maximum positive value to avoid an undesirably large loop gain. Thus, when the magnitude of the delta accumulated saturation output 184 has been below the saturation delta threshold 188 for some time, the DC loop correction signal 126 will stabilize at or near zero. When the magnitude of the delta accumulated saturation output 184 has been above the saturation delta threshold 188 for some time, the magnitude of the DC loop correction signal 126 will stop increasing at a maximum value, even if the magnitude of the delta accumulated saturation output 184 remains above the saturation delta threshold 188.

The DC loop correction signal 126 is applied in some embodiments by adding it to the DC correction control signal 130 in adder 122 to yield combined DC correction control signal 130. The relatively low gain of DC correction control signal 130 is thus increased by the addition of DC loop correction signal 126 during periods of DC offset or distortion that cause off-centered saturation in the digital samples 146 from the analog to digital converter circuit 144.

In other embodiments, the gain loop correction signal 112 and DC loop correction signal 126 may increase the loop gain of gain control signal 114 and DC correction control signal 130 in other manners, for example by scaling the gain control signal 106 and DC correction control signal 122, respectively, rather than being additively combined.

The saturation delta threshold 188 prevents the DC adjustment circuit 186 from increasing the magnitude of the DC loop correction signal 126 when only a few samples are saturated within the sliding window. This allows the analog to digital converter circuit 144 to be calibrated to use substantially all of the available range for the expected amplitude of analog signal 142 during normal operation, which may cause a small number of saturated samples, without triggering the DC adjustment circuit 186. Given the example presented above with 30 positively saturated samples in the sliding window as reported at output 156 and with 20 negatively saturated samples in the sliding window as reported at output 166, the delta accumulated saturation output 184 would have the value 10, indicating a positive DC offset in analog signal 102. If the saturation delta threshold 188 were set at 8, for example, the delta accumulated saturation output 184 value of 10 would cause the DC adjustment circuit 186 to output a value at DC loop correction signal 126 that would shift the analog signal 116 down to counter the positive DC offset. If the delta accumulated saturation output 184 had the value −10, indicating a negative DC offset in analog signal 102, the DC adjustment circuit 186 would output a value at DC loop correction signal 126 that would shift the analog signal 116 up to counter the negative DC offset. In some embodiments, The DC correction control signal 122 and DC loop correction signal 126 are opposite in sign from the DC offset appearing in analog signal 102, so a larger value for DC correction control signal 130 more rapidly corrects the DC offset.

In some embodiments, the DC correction is given priority over the gain correction, thus correcting any DC offset before attempting to correct gain distortion.

Turning to FIG. 2, an adjustment circuit 200 yielding a loop correction term 224 is depicted that may be suitable for use in place of gain adjustment circuit 174 in accordance with some embodiments of the present inventions. A comparator 206 compares an accumulator sum 202 with a sample threshold 204, asserting the output 210 when the accumulator sum 202 is greater than the sample threshold 204. A multiplexer 212 selects a positive step value 214 when output 210 is asserted and a negative step value 216 when output 210 is not asserted, yielding either a positive or negative step at output 220. An accumulator 222 accumulates the step values presented at output 220 and yielding a loop correction term 224 that increases when the output 220 is positive and that decreases when output 220 is negative. The accumulator 222 stops increasing the loop correction term 224 at a maximum value, even if the output 220 remains positive, and stops decreasing the loop correction term 224 at zero, even if the output 220 remains negative.

The DC adjustment circuit 186 may be similar to the adjustment circuit 200 of FIG. 2, except that it is adapted to operate in both positive and negative regions, for example by including two comparators to compare the accumulator delta with both a positive and a negative version of the saturation delta threshold, and having the accumulator 222 adapted to stop at or near zero when the DC offset has been corrected and to stop at either a maximum positive value or a maximum negative value when a DC offset has been present for some time.

FIG. 3 is a flow diagram 300 showing a method for correcting a DC offset while processing data with saturation-based loop control assistance in accordance with some embodiments of the present inventions. Following flow diagram 300, as each new sample is provided by an analog to digital converter, positive and negative saturation counters corresponding to a sliding window are updated (block 302). For example, an adc_sat_val_p value and an adc_sat_val_n value are updated based on a count of positive and negative saturated samples, respectively, within the sliding window. A saturation delta is calculated from the positive and negative analog to digital converter saturation counters (block 304), for example by subtracting the value from the negative analog to digital converter saturation counter from the value from the positive analog to digital converter saturation counter. It is determined whether the magnitude of the saturation delta is greater than a threshold (block 306). (The operations of blocks 304 and 306 may be accomplished, for example, as |adc_sat_val_p−adc_sat_val_n|>=adc_sat_delta_th?) Where the magnitude of the saturation delta is greater than the threshold (block 306), it is determined whether the DC offset is positive or negative (block 310). (If adc_sat_val_p−adc_sat_val_n>0, then adc_sat_dc_flag=1; if adc_sat_val_p−adc_sat_val_n<0, then adc_sat_dc_flag=−1.) Either a positive or negative DC step value is added to a DC correction term (block 312). (adc_sat_dc_accum+=adc_sat_dc_flag*adc_sat_dc_step) The DC correction term is added to the DC loop error signal (block 314). (analog_dc_correction=analog_dc_loop+adc_sat_dc_accum) The sliding window is shifted as the next sample becomes available (block 316).

Where the magnitude of the saturation delta is not greater than the threshold (block 306), it is determined whether the DC correction term is zero (block 320). Where the DC correction term is zero (block 320), the sliding window is shifted as the next sample becomes available (block 324). Where the DC correction term is not zero (block 320), the magnitude of the DC correction term is decreased by the DC step value (block 322). (adc_sat_dc_accum−=sign(adc_sat_dc_accum)*adc_sat_dc_step) The sliding window is shifted as the next sample becomes available (block 324).

Figure 4:
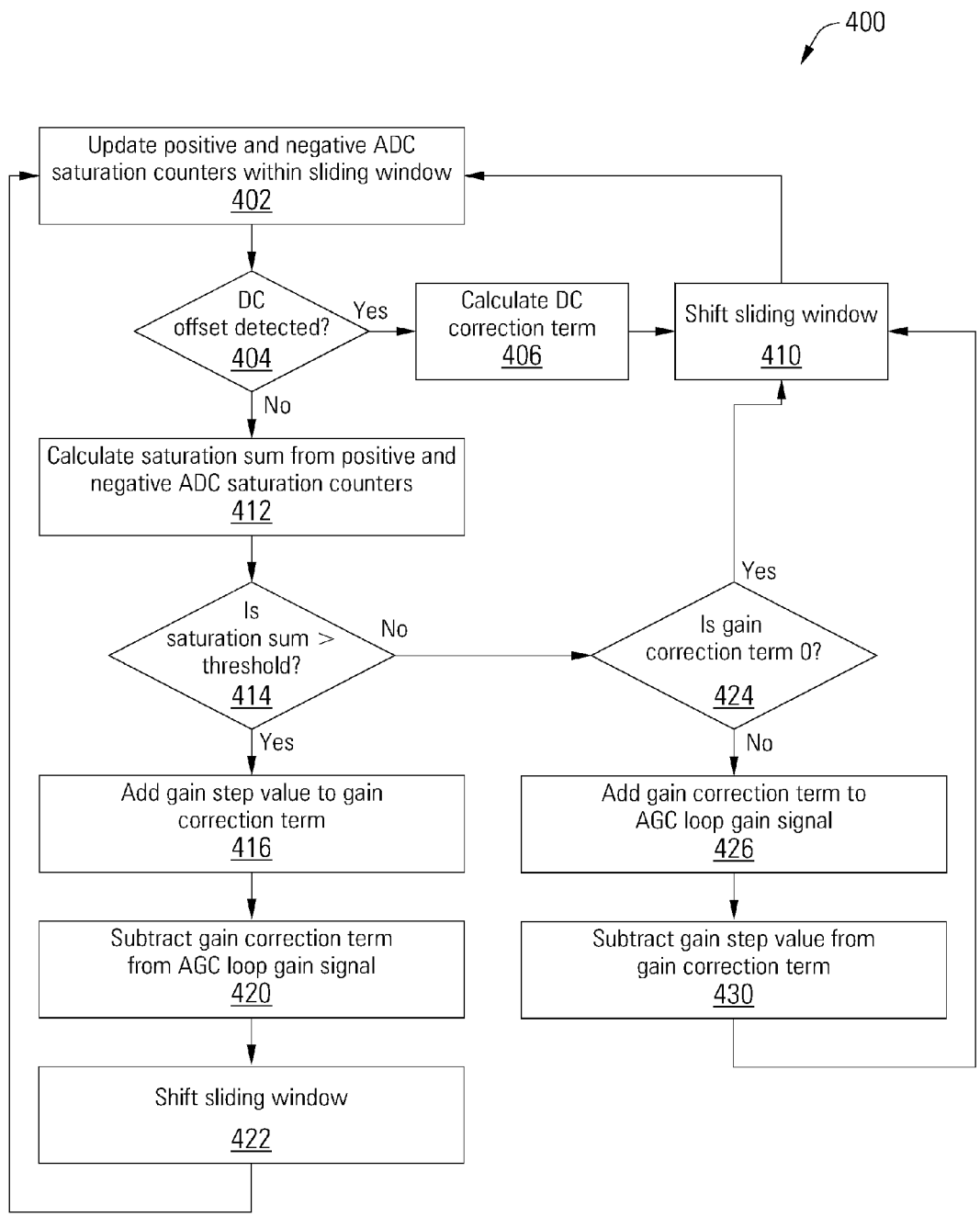
FIG. 4 is a flow diagram showing a method for generating loop correction terms based at least in part on analog to digital converter saturation information that may be performed while processing data in accordance with some embodiments of the present inventions.

FIG. 4 is a flow diagram 400 showing a method for generating loop correction terms based at least in part on analog to digital converter saturation information that may be performed while processing data in accordance with some embodiments of the present inventions. Following flow diagram 400, as each new sample is provided by an analog to digital converter, positive and negative saturation counters corresponding to a sliding window are updated (block 402). For example, an adc_sat_val_p value and an adc_sat_val_n value are updated based on a count of positive and negative saturated samples, respectively, within the sliding window. It is determined whether a DC offset exists (block 404), and if so, the DC correction term is calculated (block 406) and the sliding window is shifted (block 410). Blocks 404, 406 and 410 may be performed as disclosed above with respect to FIG. 3.

A saturation sum is calculated from the positive and negative analog to digital converter saturation counters (block 412), for example by adding the value from the negative analog to digital converter saturation counter to the value from the positive analog to digital converter saturation counter. It is determined whether the magnitude of the saturation sum is greater than a threshold (block 414). (adc_sat_val>=adc_sat_th?) Where the magnitude of the saturation sum is greater than the threshold (block 414), a gain step value is added to the gain correction term (block 416). (adc_sat_gain_accum+=adc_sat_vga_step) The gain correction term is subtracted from the AGC loop gain signal (block 420). (gainreg−=adc_sat_vga_step) The sliding window is shifted as the next sample becomes available (block 422).

Where the magnitude of the saturation sum is not greater than the threshold (block 414), it is determined whether the gain correction term is 0 (block 424). Where gain correction term is 0 (block 424), the sliding window is shifted as the next sample becomes available (block 410). Where gain correction term is not 0 (block 424), the gain correction term is added to the AGC loop gain signal (block 426). (gainreg+=adc_sat_vga_step) The gain step value is subtracted from the gain correction term (block 430). (adc_sat_gain_accum−=adc_sat_vga_step) The sliding window is shifted as the next sample becomes available (block 410).

Figure 5:
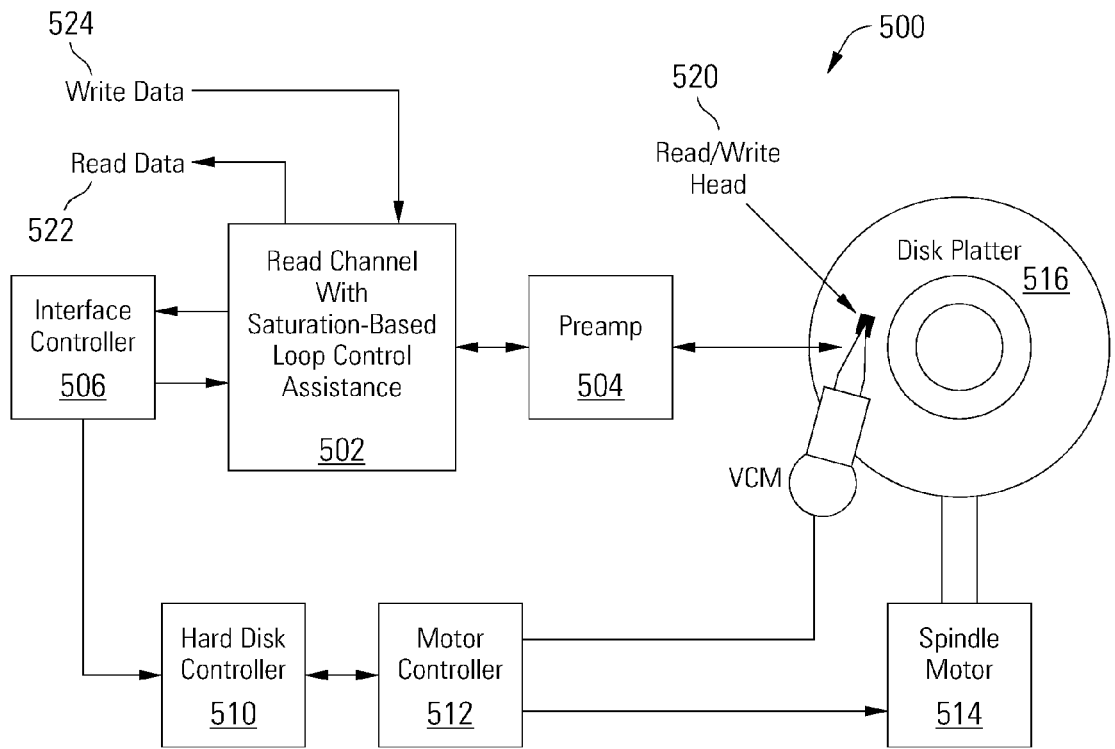
FIG. 5 depicts a storage system including saturation-based loop control assistance in accordance with some embodiments of the present inventions.
Figure 6:
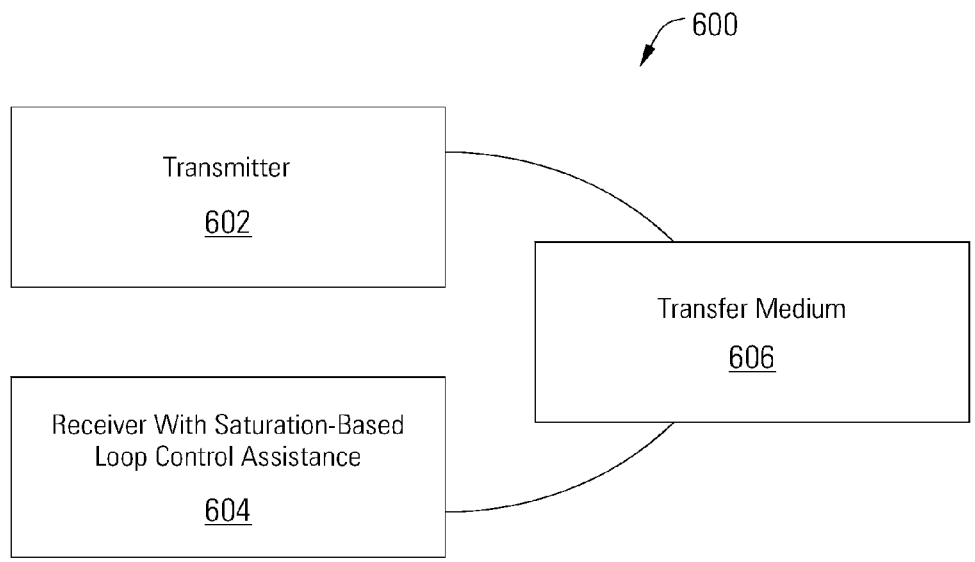
FIG. 6 depicts a data transmission system including saturation-based loop control assistance in accordance with some embodiments of the present inventions.

Although the saturation-based loop control assistance disclosed herein is not limited to any particular application, several examples of applications are presented in FIGS. 5 and 6 that benefit from embodiments of the present inventions. Turning to FIG. 5, a storage system 500 is illustrated as an example application of saturation-based loop control assistance in accordance with some embodiments of the present inventions. The storage system 500 includes a read channel circuit 502 with saturation-based loop control assistance in accordance with some embodiments of the present invention. Storage system 500 may be, for example, a hard disk drive. Storage system 500 also includes a preamplifier 504, an interface controller 506, a hard disk controller 510, a motor controller 512, a spindle motor 514, a disk platter 516, and a read/write head assembly 520. Interface controller 506 controls addressing and timing of data to/from disk platter 516. The data on disk platter 516 consists of groups of magnetic signals that may be detected by read/write head assembly 520 when the assembly is properly positioned over disk platter 516. In one embodiment, disk platter 516 includes magnetic signals recorded in accordance with either a longitudinal or a perpendicular recording scheme.

In a typical read operation, read/write head assembly 520 is accurately positioned by motor controller 512 over a desired data track on disk platter 516. Motor controller 512 both positions read/write head assembly 520 in relation to disk platter 516 and drives spindle motor 514 by moving read/write head assembly 520 to the proper data track on disk platter 516 under the direction of hard disk controller 510. Spindle motor 514 spins disk platter 516 at a determined spin rate (RPMs). Once read/write head assembly 520 is positioned adjacent the proper data track, magnetic signals representing data on disk platter 516 are sensed by read/write head assembly 520 as disk platter 516 is rotated by spindle motor 514. The sensed magnetic signals are provided as a continuous, minute analog signal representative of the magnetic data on disk platter 516. This minute analog signal is transferred from read/write head assembly 520 to read channel circuit 502 via preamplifier 504. Preamplifier 504 is operable to amplify the minute analog signals accessed from disk platter 516. In turn, read channel circuit 502 processes the analog signals in a variable gain amplifier and DC correction circuit, then digitizes and decodes the received analog signal to recreate the information originally written to disk platter 516. This data is provided as read data 522 to a receiving circuit. As part of processing and digitizing the received information, read channel circuit 502 performs saturation-based loop control assistance to control the variable gain amplifier and DC correction circuit, effectively increasing the loop gain of feedback error signals in the presence of distortions which saturate the analog to digital converter. Such saturation-based loop control assistance may be implemented consistent with that disclosed above in relation to FIGS. 1-2. In some cases, the saturation-based loop control assistance may be performed consistent with the flow diagrams disclosed above in relation to FIGS. 3-4. A write operation is substantially the opposite of the preceding read operation with write data 524 being provided to read channel circuit 502. This data is then encoded and written to disk platter 516.

It should be noted that storage system 500 may be integrated into a larger storage system such as, for example, a RAID (redundant array of inexpensive disks or redundant array of independent disks) based storage system. Such a RAID storage system increases stability and reliability through redundancy, combining multiple disks as a logical unit. Data may be spread across a number of disks included in the RAID storage system according to a variety of algorithms and accessed by an operating system as if it were a single disk. For example, data may be mirrored to multiple disks in the RAID storage system, or may be sliced and distributed across multiple disks in a number of techniques. If a small number of disks in the RAID storage system fail or become unavailable, error correction techniques may be used to recreate the missing data based on the remaining portions of the data from the other disks in the RAID storage system. The disks in the RAID storage system may be, but are not limited to, individual storage systems such storage system 500, and may be located in close proximity to each other or distributed more widely for increased security. In a write operation, write data is provided to a controller, which stores the write data across the disks, for example by mirroring or by striping the write data. In a read operation, the controller retrieves the data from the disks. The controller then yields the resulting read data as if the RAID storage system were a single disk.

Turning to FIG. 6, a wireless communication system 600 or data transmission device including a receiver 604 with saturation-based loop control assistance is shown in accordance with some embodiments of the present invention. Communication system 600 includes a transmitter 602 that is operable to transmit encoded information via a transfer medium 606 as is known in the art. The encoded data is received from transfer medium 606 by receiver 604. Receiver 604 uses saturation-based loop control assistance to correct distortion during data processing. Such saturation-based loop control assistance may be implemented consistent with that disclosed above in relation to FIGS. 1-2. In some cases, the saturation-based loop control assistance may be performed consistent with the flow diagrams disclosed above in relation to FIGS. 3-4.

It should be noted that the various blocks discussed in the above application may be implemented in integrated circuits along with other functionality. Such integrated circuits may include all of the functions of a given block, system or circuit, or a subset of the block, system or circuit. Further, elements of the blocks, systems or circuits may be implemented across multiple integrated circuits. Such integrated circuits may be any type of integrated circuit known in the art including, but are not limited to, a monolithic integrated circuit, a flip chip integrated circuit, a multichip module integrated circuit, and/or a mixed signal integrated circuit. It should also be noted that various functions of the blocks, systems or circuits discussed herein may be implemented in either software or firmware. In some such cases, the entire system, block or circuit may be implemented using its software or firmware equivalent. In other cases, the one part of a given system, block or circuit may be implemented in software or firmware, while other parts are implemented in hardware.

In conclusion, the invention provides novel systems, devices, methods and arrangements for saturation-based loop control assistance. While detailed descriptions of one or more embodiments of the invention have been given above, various alternatives, modifications, and equivalents will be apparent to those skilled in the art without varying from the spirit of the invention. Therefore, the above description should not be taken as limiting the scope of the invention, which is defined by the appended claims.

What is claimed is:

1. A data processing system comprising:
   an analog to digital converter operable to sample an analog signal to yield digital samples;
   at least one positive saturation detector operable to determine whether the digital samples are above a threshold;
   at least one negative saturation detector operable to determine how many of the digital samples are below a lower threshold;
   an accumulator operable to determine how many of the digital samples are above the threshold within a sliding window;
   a second accumulator operable to determine how many of the digital samples are below the lower threshold within the sliding window, and
   a loop correction signal generating circuit operable to generate a loop correction signal based at least in part on an output of the accumulator, further comprising an adder operable to add the output of the accumulator and an output of the second accumulator, wherein the loop correction signal generating circuit is operable to generate the loop correction signal based on an output from the adder.

2. The data processing system of claim 1, wherein the loop correction signal generating circuit is operable to gradually increase the loop correction signal when a number of the digital samples that are above the threshold is above a second threshold, and to gradually decrease the loop correction signal when the number of the digital samples that are above the threshold is not above the second threshold.

3. The data processing system of claim 1, further comprising a second adder operable to add the loop correction signal to a gain signal from an automatic gain control loop.

4. The data processing system of claim 1, wherein the data processing system is implemented as an integrated circuit.

5. The data processing system of claim 1, wherein the data processing system is incorporated in a storage device.

6. The data processing system of claim 1, wherein the data processing system is incorporated in a storage system comprising a redundant array of independent disks.

7. The data processing system of claim 1, wherein the data processing system is incorporated in a transmission system.

8. The data processing system of claim 1, further comprising a subtractor operable to subtract an output of the second accumulator from the output of the accumulator; and
 a second loop correction signal generating circuit operable to generate a second loop correction signal based on an output of the subtractor.

9. The data processing system of claim 8, further comprising a second subtractor operable to subtract the second loop correction signal from a DC offset control signal from a DC compensation loop.

10. A data processing system comprising:
 an analog to digital converter operable to sample an analog signal to yield digital samples;
 at least one positive saturation detector operable to determine whether the digital samples are above a threshold;
 at least one negative saturation detector operable to determine how many of the digital samples are below a lower threshold;
 an accumulator operable to determine how many of the digital samples are above the threshold within a sliding window;
 a second accumulator operable to determine how many of the digital samples are below the lower threshold within the sliding window, and
 a loop correction signal generating circuit operable to generate a loop correction signal based at least in part on an output of the accumulator, further comprising:
 a subtractor operable to subtract an output of the second accumulator from the output of the accumulator; and
 a second loop correction signal generating circuit operable to generate a second loop correction signal based on an output of the subtractor.

11. The data processing system of claim 10, wherein the second loop correction signal generating circuit is operable to gradually decrease a magnitude of the second loop correction signal in a negative direction when the output of the subtractor is above a second threshold, and to gradually increase the second loop correction signal when the output of the subtractor is below a negative version of the second threshold, and to gradually return the second loop correction signal toward zero when the magnitude of the output of the subtractor is less than the second threshold.

12. The data processing system of claim 10, further comprising a second subtractor operable to subtract the second loop correction signal from a DC offset control signal from a DC compensation loop.

13. The data processing system of claim 10, further comprising an adder operable to add the output of the accumulator and an output of the second accumulator, wherein the loop correction signal generating circuit is operable to generate the loop correction signal based on an output from the adder.

14. The data processing system of claim 13, further comprising a second adder operable to add the loop correction signal to a gain signal from an automatic gain control loop.

15. The data processing system of claim 10, wherein the loop correction signal generating circuit is operable to gradually increase the loop correction signal when a number of the digital samples that are above the threshold is above a second threshold, and to gradually decrease the loop correction signal when the number of the digital samples that are above the threshold is not above the second threshold.

16. A method for data processing, comprising:
 converting an analog signal to a series of digital samples;
 counting a number of the digital samples within a sliding window that are above an upper threshold;
 counting a second number of the digital samples within the sliding window that are below a lower threshold;
 adding the number and the second number to yield a saturated digital sample sum;
 subtracting the second number from the number to yield a saturated digital sample delta;
 generating a gain loop correction signal based at least in part on the saturated digital sample sum; and
 generating a DC loop correction signal based at least in part on the saturated digital sample delta, wherein generating the gain loop correction signal comprises:
 comparing the saturated digital sample sum with a saturation threshold;
 adding a step value to the gain loop correction signal when the saturated digital sample sum is greater than the saturation threshold and the gain loop correction signal is below a maximum value; and
 subtracting the step value from the gain loop correction signal when the saturated digital sample sum is less than the saturation threshold and the gain loop correction signal is greater than zero.

17. The method of claim 16, further comprising adding the gain loop correction signal to a gain signal from an automatic gain control loop.

18. The method of claim 16, wherein generating the DC loop correction signal comprises:
 comparing a magnitude of the saturated digital sample delta with a saturation threshold;
 determining a direction of a DC offset;
 increasing a magnitude of the DC loop correction signal by a step value when the magnitude of the saturated digital sample delta is greater than the saturation threshold and less than a maximum value, wherein a sign of the step value is based on the direction of the DC offset.

19. The method of claim 18, wherein generating the DC loop correction signal further comprises:
 decreasing the magnitude of the DC loop correction signal by the step value when the magnitude of the saturated digital sample delta is less than the saturation threshold and greater than zero, wherein the sign of the step value is based on the direction of the DC offset.

20. The method of claim 19, further comprising subtracting the DC loop correction signal from a DC offset control signal from a DC compensation loop.

* * * * *